(12) United States Patent
Taguchi et al.

(10) Patent No.: US 11,769,829 B1
(45) Date of Patent: Sep. 26, 2023

(54) SEMICONDUCTOR DEVICE

(71) Applicant: Nuvoton Technology Corporation Japan, Kyoto (JP)

(72) Inventors: Masahide Taguchi, Kyoto (JP); Eiji Yasuda, Osaka (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 0 days.

(21) Appl. No.: 18/248,344

(22) PCT Filed: Jul. 21, 2022

(86) PCT No.: PCT/JP2022/028360
§ 371 (c)(1),
(2) Date: Apr. 7, 2023

(87) PCT Pub. No.: WO2023/062906
PCT Pub. Date: Apr. 20, 2023

Related U.S. Application Data

(60) Provisional application No. 63/256,133, filed on Oct. 15, 2021.

(51) Int. Cl.
*H01L 29/78* (2006.01)
*H01L 23/482* (2006.01)
*H01L 29/423* (2006.01)

(52) U.S. Cl.
CPC ...... *H01L 29/7813* (2013.01); *H01L 23/4824* (2013.01); *H01L 29/4238* (2013.01)

(58) Field of Classification Search
CPC ............. H01L 23/4824; H01L 29/7813; H01L 29/4238

(Continued)

(56) References Cited

U.S. PATENT DOCUMENTS

2001/0045635 A1    11/2001   Kinzer et al.
2008/0265314 A1    10/2008   Kobayashi
(Continued)

FOREIGN PATENT DOCUMENTS

JP       10-313010 A     11/1998
JP    2002-353452 A     12/2002
(Continued)

OTHER PUBLICATIONS

International Search Report dated Oct. 4, 2022 issued in International Patent Application No. PCT/JP2022/028360.

(Continued)

*Primary Examiner* — Igwe U Anya
(74) *Attorney, Agent, or Firm* — McDermott Will & Emery LLP

(57) ABSTRACT

A semiconductor device includes: a semiconductor layer in a rectangular shape in a plan view; a transistor provided in a first region; and a drain lead-out region provided in a second region. A border line is a straight line parallel to longer sides of the semiconductor layer. The first region includes a plurality of source pads and gate pads. The second region includes a plurality of drain pads. One gate pad among the gate pads is disposed to dispose none of the plurality of source pads between (i) the one gate pad and (ii) one longer side and one shorter side. One drain pad among the plurality of drain pads is in the same shape as the one gate pad and is disposed close to a second vertex. The plurality of source pads include a source pad that is in a rectangular shape or an obround shape having a longitudinal direction parallel to the longer sides of the semiconductor layer.

7 Claims, 8 Drawing Sheets

(58) Field of Classification Search
USPC .......................................................... 257/401
See application file for complete search history.

(56) References Cited

U.S. PATENT DOCUMENTS

| | | | |
|---|---|---|---|
| 2009/0315175 | A1 | 12/2009 | Okada et al. |
| 2012/0267711 | A1 | 10/2012 | Grebs et al. |
| 2014/0367770 | A1 | 12/2014 | Aoki et al. |
| 2020/0365729 | A1* | 11/2020 | Okawa ................ H01L 29/7827 |
| 2022/0109048 | A1* | 4/2022 | Li ........................ H01L 29/7786 |

FOREIGN PATENT DOCUMENTS

| | | | |
|---|---|---|---|
| JP | 2002-368218 | A | 12/2002 |
| JP | 2004-502293 | A | 1/2004 |
| JP | 2008-258499 | A | 10/2008 |
| JP | 2012-182240 | A | 9/2012 |
| JP | 5132977 | B2 | 1/2013 |
| JP | 6131114 | B2 | 5/2017 |
| JP | 6775872 | B1 | 10/2020 |
| WO | 01/59842 | A1 | 8/2001 |

OTHER PUBLICATIONS

Written Opinion of the International Searching Authority dated Oct. 4, 2022 issued in International Patent Application No. PCT/JP2022/028360, with English translation.

* cited by examiner

FIG. 4

| Level | 1 | 2 | 3 |
|---|---|---|---|
| Size | 3.05 × 3.05 mm | 3.05 × 3.05 mm | 3.05 × 3.05 mm |
| Placement in plan view (All pads are circles having the same shape.) | Border 90, Source/Drain layout with Gate | Border 90, Source/Drain layout with Gate | Border 90, Source/Drain layout with Gate |
| Area occupancy ratio — Gate | 1 | 1 | 1 |
| Area occupancy ratio — Source | 7 | 6 | 5 |
| Area occupancy ratio — Drain | 1 | 2 | 3 |
| On-resistance @VGS 10 V | 17.5 mΩ | 13.9 mΩ | 13.9 mΩ |
| On-resistance @VGS 4.5 V | 22.4 mΩ | 19.4 mΩ | 19.7 mΩ |

FIG. 5

| Level | 3 | 4 | 5 |
|---|---|---|---|
| Size | 3.05 × 3.05 mm | 3.05 × 3.05 mm | 3.05 × 3.05 mm |
| Arrangement in plan view | Source/Drain (3×3 circles), Gate | Source/Drain (5×4 circles), Gate | Source/Drain (stripes), Gate |
| Partition ratio (A1:A2) | 2:1 | 4:1 | 4:1 |
| On-resistance @VGS 10 V | 13.9 mΩ | 13.9 mΩ | 13.7 mΩ |
| On-resistance @VGS 4.5 V | 19.7 mΩ | 19.7 mΩ | 19.4 mΩ |

G : Gate Pad
S : Source Pad
D : Drain Pad

G : Gate Pad
S : Source Pad
D : Drain Pad

G : Gate Pad
S : Source Pad
D : Drain Pad

G : Gate Pad
S : Source Pad
D : Drain Pad

G : Gate Pad
S : Source Pad
D : Drain Pad

G : Gate Pad
S : Source Pad
D : Drain Pad

G : Gate Pad
S : Source Pad
D : Drain Pad

SEMICONDUCTOR DEVICE

CROSS-REFERENCE OF RELATED APPLICATIONS

This application is the U.S. National Phase under 35 U.S.C. § 371 of International Patent Application No. PCT/JP2022/028360, filed on Jul. 21, 2022, which in turn claims the benefit of U.S. Provisional Patent Application No. 63/256,133, filed on Oct. 15, 2021, the entire disclosures of which Applications are incorporated by reference herein.

TECHNICAL FIELD

The present disclosure relates to a semiconductor device and in particular to a chip-size-package type semiconductor device.

BACKGROUND ART

There has been a demand for a vertical field-effect transistor to pass a heavy current.

CITATION LIST

Patent Literature

[PTL 1] Japanese Unexamined Patent Application Publication No. 2002-353452
[PTL 2] Japanese Patent No. 6131114

SUMMARY OF INVENTION

Technical Problem

In recent years, for in-vehicle or industrial use, there has been a demand for a chip-size-package type vertical field-effect transistor including a gate pad, a source pad, and a drain pad on one principal surface to control the passage of a heavy current of approximately several amperes. In order for the vertical field-effect transistor to reduce on-resistance without increasing a chip area as much as possible, it is necessary to appropriately place a control region (gate), an effective region (source), and a drain region (drain) in a plane. Patent Literatures 1 and 2 each disclose the placement of a control region, an effective region, a drain region or the placement of control region pads, effective region pads, and drain region pads in a vertical field-effect transistor. However, both of the PTLs have some room to improve the effective use of a limited chip area in terms of passing a heavy current.

Solution to Problem

In order to solve the above-described problem, a semiconductor device according to the present disclosure is a semiconductor device that is a facedown mountable, chip-size-package type semiconductor device, the semiconductor device including: a semiconductor layer; a vertical field-effect transistor provided in a first region in the semiconductor layer; and a drain lead-out region provided in a second region adjacent to the first region in the semiconductor layer in a plan view of the semiconductor layer, wherein the semiconductor layer is in a rectangular shape in the plan view, when, in the plan view, out of longer sides of the semiconductor layer, a longer side included in the first region and a longer side included in the second region are referred to as one longer side and an other longer side, respectively, and out of shorter sides of the semiconductor layer, a shorter side defining a first vertex with the one longer side is referred to as one shorter side, and a shorter side opposite to the one shorter side is referred to as an other shorter side, a border line between the first region and the second region is a straight line parallel to the longer sides of the semiconductor layer in the plan view, the first region includes a plurality of source pads and one or more gate pads on a surface of the semiconductor layer, the second region includes a plurality of drain pads on the surface of the semiconductor layer, at least one gate pad among the one or more gate pads is disposed to dispose none of the plurality of source pads between (i) the at least one gate pad and (ii) the one longer side and the one shorter side in the plan view, at least one drain pad among the plurality of drain pads is in a same shape as the at least one gate pad in the plan view, and is disposed close to a second vertex of the semiconductor layer in the plan view, the second vertex being diagonally opposite to the first vertex, the plurality of source pads include a plurality of source pads that are, in the plan view, in a rectangular shape or an obround shape having a longitudinal direction parallel to the longer sides of the semiconductor layer, the plurality of drain pads include a drain pad that is, in the plan view, in a rectangular shape or an obround shape having a longitudinal direction parallel to the longer sides of the semiconductor layer, the plurality of source pads in the rectangular shape or the obround shape are disposed in stripes at regular intervals in the plan view, and in the plan view, spaces between the plurality of source pads in the rectangular shape or the obround shape are equal to a space between a source pad and the drain pad in the rectangular shape or the obround shape that are opposite to each other across the border line, the source pad being included in the plurality of source pads in the rectangular shape or the obround shape.

The above configuration makes it possible to provide a semiconductor device capable of not only reducing on-resistance by passing a heavy current using a limited chip area effectively but also reducing local heat generation by avoiding current concentration.

Advantageous Effects of Invention

The present disclosure has an object to provide a semiconductor device capable of reducing on-resistance and suppressing an increase in temperature.

BRIEF DESCRIPTION OF DRAWINGS

FIG. 4 is a table summarizing results of simulations performed by inventors.

FIG. 5 is a table summarizing results of simulations performed by the inventors.

DESCRIPTION OF EMBODIMENTS

Embodiment 1

(1. Structure of Semiconductor Device)

Hereinafter, a structure of a vertical field-effect transistor in the present disclosure will be described.

Figure 1:
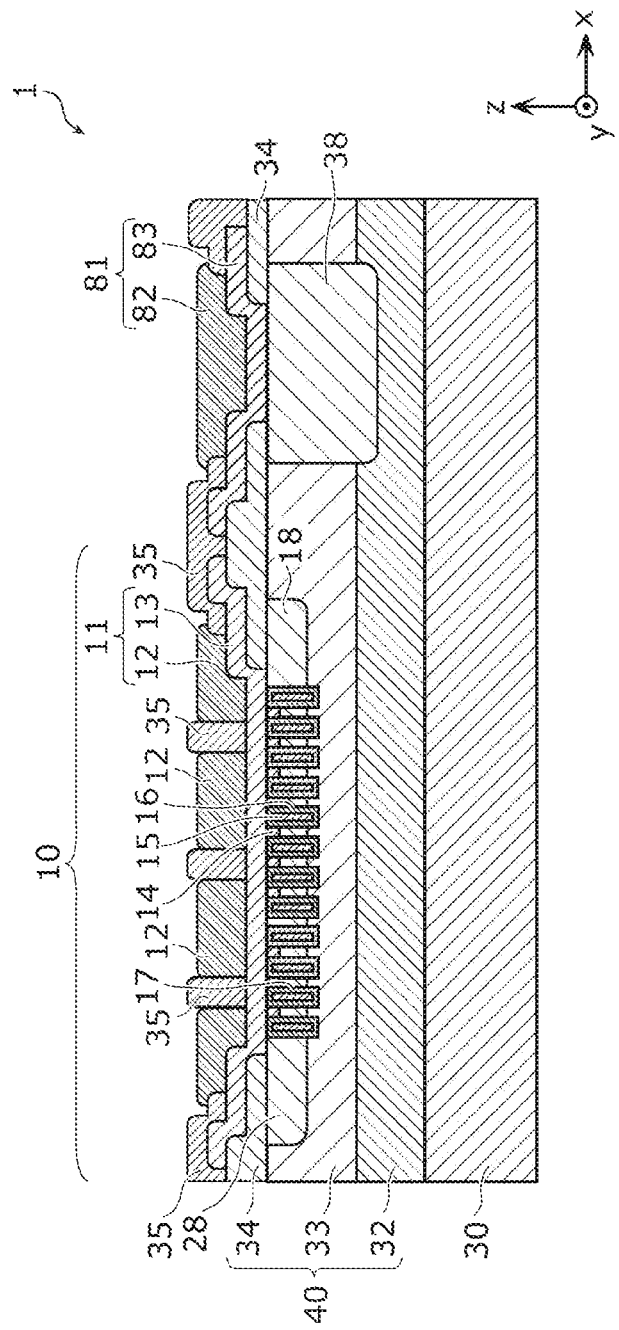
FIG. 1 is a cross-sectional view illustrating an example of a structure of a semiconductor device according to Embodiment 1.
Figure 2:
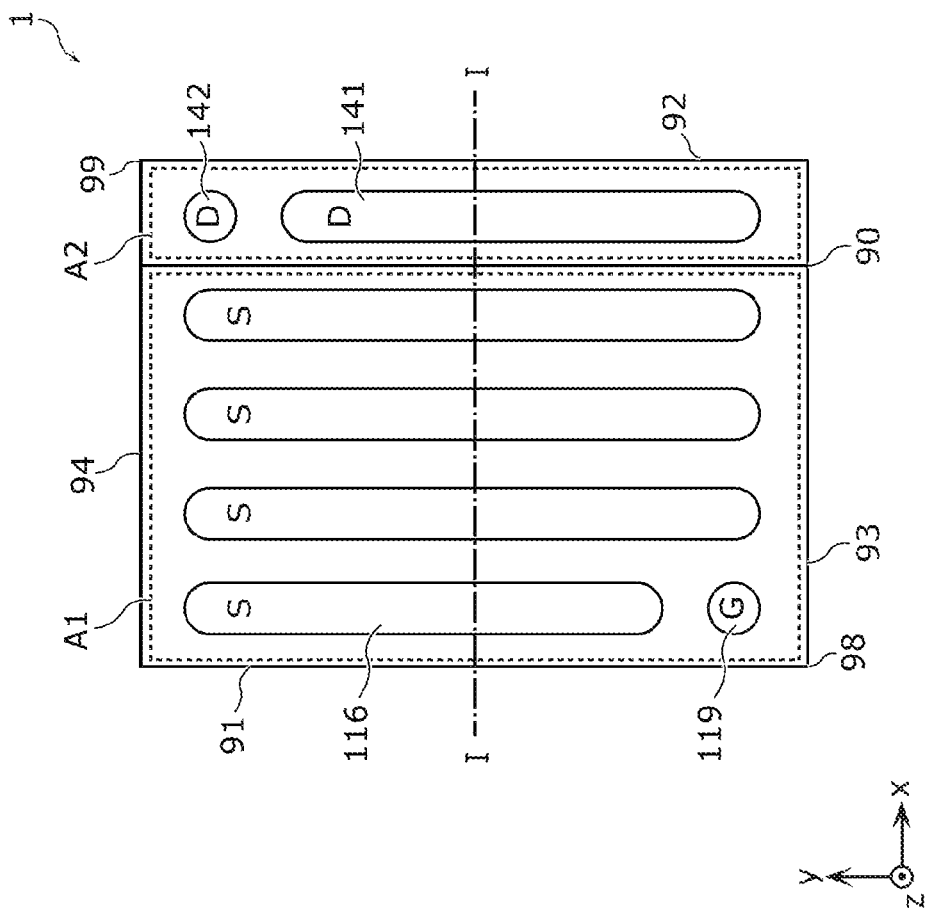
FIG. 2 is a plan view illustrating an example of a structure of the semiconductor device according to Embodiment 1.

FIG. 1 is a cross-sectional view illustrating an example of a structure of a semiconductor device. FIG. 2 is a plan view of FIG. 1. The size, shape, and pad placement of the semiconductor device are one example. FIG. 1 shows a cross section along line I-I in FIG. 2.

As shown in FIG. 1 and FIG. 2, semiconductor device 1 incudes: semiconductor layer 40; metal layer 30; vertical field-effect transistor (hereinafter also referred to as "transistor 10") formed in first region A1 in semiconductor layer 40; and drain lead-out region 38 formed in second region A2 in semiconductor layer 40. Here, as shown in FIG. 2, first region A1 and second region A2 are adjacent to each other in a plan view of semiconductor layer 40. As shown in FIG. 2, first region A1 and second region A2 form border line 90 by necessity. Border line 90 is a dividing line that is usually shown by a dashed line in the figures of the present disclosure. In the example shown in FIG. 2, border line 90 is a straight line. What is viewed as border line 90 will be described later.

Semiconductor layer 40 is formed by stacking semiconductor substrate 32 and low-concentration impurity layer 33. Semiconductor substrate 32 is disposed on a rear surface side of semiconductor layer 40 and includes silicon containing impurities of a first conductivity type. Low-concentration impurity layer 33 is disposed on a front surface side of semiconductor layer 40, is formed in contact with semiconductor substrate 32, and contains impurities of the first conductivity type having a concentration lower than a concentration of the impurities of the first conductivity type contained in semiconductor substrate 32. Low-concentration impurity layer 33 may be formed on semiconductor substrate 32 by, for example, epitaxial growth. It should be noted that low-concentration impurity layer 33 is also a drift layer of transistor 10 and may be referred to as a drift layer in the Description.

Metal layer 30 is formed in contact with a rear surface of semiconductor layer 40 and includes silver (Ag) or copper (Cu). It should be noted that metal layer 30 may contain trace amounts of non-metallic elements introduced as impurities in the manufacturing process of metal material. Additionally, metal layer 30 may or may not be formed on the entire rear surface of semiconductor layer 40.

As shown in FIG. 1 and FIG. 2, body region 18 containing impurities of a second conductivity type different from the first conductivity type is formed in first region A1 of low-concentration impurity layer 33. Source region 14 containing impurities of the first conductivity type, gate conductor 15, and gate insulating film 16 are formed in body region 18. Gate conductor 15 and gate insulating film 16 are formed in each of a plurality of gate trenches 17 that penetrate through body region 18 from a top surface of semiconductor layer 40 to a depth that reaches a portion of low-concentration impurity layer 33. Source electrode 11 includes portion 12 and portion 13. Portion 12 is connected to source region 14 and body region 18 via portion 13. Gate conductor 15 is an embedded gate electrode embedded in semiconductor layer 40, and is electrically connected to gate pad 119.

Portion 12 of source electrode 11 is a layer joined with solder at the time of reflow in facedown mounting, and may comprise, as a non-limiting example, a metal material including at least one of nickel, titanium, tungsten, or palladium. The surface of portion 12 may be plated with, for example, gold.

Portion 13 of source electrode 11 is a layer connecting portion 12 and semiconductor layer 40, and may comprise, as a non-limiting example, a metal material including at least one of aluminum, copper, gold, or silver.

Drain lead-out region 38 is formed at a depth that reaches semiconductor substrate 32 in low-concentration impurity layer 33, in second region A2 of low-concentration impurity layer 33. Drain lead-out region 38 is a layer containing impurities of the first conductivity type having a concentration higher than the concentration of the impurities of the first conductivity type contained in low-concentration impurity layer 33.

Portion 82 of drain electrode 81 is a layer joined with solder at the time of reflow in facedown mounting, and may comprise, as a non-limiting example, a metal material including at least one of nickel, titanium, tungsten, or palladium. The surface of portion 82 may plated with, for example, gold.

Portion 83 of drain electrode 81 is a layer connecting portion 82 and semiconductor layer 40, and may comprise, as a non-limiting example, a metal material including at least one of aluminum, copper, gold, or silver.

The above configuration of transistor 10 causes semiconductor substrate 32 to function as a drain region of transistor 10. A portion of low-concentration impurity layer 33 on a side adjacent to semiconductor substrate 32 may also function as a drain region. In addition, metal layer 30 functions as a drain electrode of transistor 10.

As shown in FIG. 1, body region 18 is covered with interlayer insulating layer 34 having an opening, and portion 13 of source electrode 11 connected to source region 14 is provided via the opening of interlayer insulating layer 34. Interlayer insulating layer 34 and portion 13 of source electrode 11 are covered with passivation layer 35 having an opening, and portion 12 connected to portion 13 of source electrode 11 is provided via the opening of passivation layer 35.

Drain lead-out region 38 is covered with interlayer insulating layer 34 having an opening, and portion 83 of drain electrode 81 connected to drain lead-out region 38 is provided via the opening of interlayer insulating layer 34.

Interlayer insulating layer 34 and portion 83 of drain electrode 81 are covered with passivation layer 35 having an opening, and portion 82 connected to portion 83 of drain electrode 81 is provided via the opening of passivation layer 35.

Accordingly, a plurality of source pads 116 each refer to a region in which source electrode 11 is partially exposed to the surface of semiconductor device 1, that is, a terminal portion; and a plurality of drain pads 141 each refer to a region in which drain electrode 81 is partially exposed to the surface of semiconductor device 1, that is, a terminal portion. Similarly, one or more gate pads 119 each refer to a region in which gate electrode 19 (not shown in FIG. 1 and FIG. 2) is partially exposed to the surface of semiconductor device 1, that is, a terminal portion In semiconductor device 1, for example, assuming that the first conductivity type is N-type and the second conductivity type is P-type, source region 14, semiconductor substrate 32, low-concentration impurity layer 33, and drain lead-out region 38 may be N-type semiconductors, and body region 18 may be a P-type semiconductor.

Moreover, in semiconductor device 1, for example, assuming that the first conductivity type is P-type and the second conductivity type is N-type, source region 14, semiconductor substrate 32, low-concentration impurity layer 33, and drain lead-out region 38 may be P-type semiconductors, and body region 18 may be an N-type semiconductor.

The following description illustrates conduction operation of semiconductor device 1 when, assuming that the first conductivity type is N-type and the second conductivity type is P-type, transistor 10 is what is called an N-channel transistor.

(2. Operation of Vertical Field-Effect Transistor)

Figure 3A:
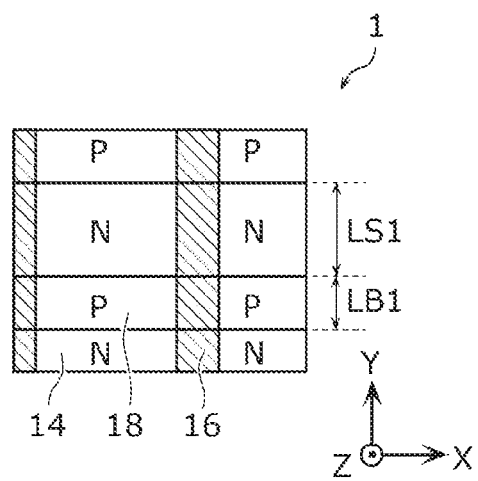
FIG. 3A is a plan view of the configuration of an approximate single unit of a vertical transistor according to Embodiment 1.
Figure 3B:
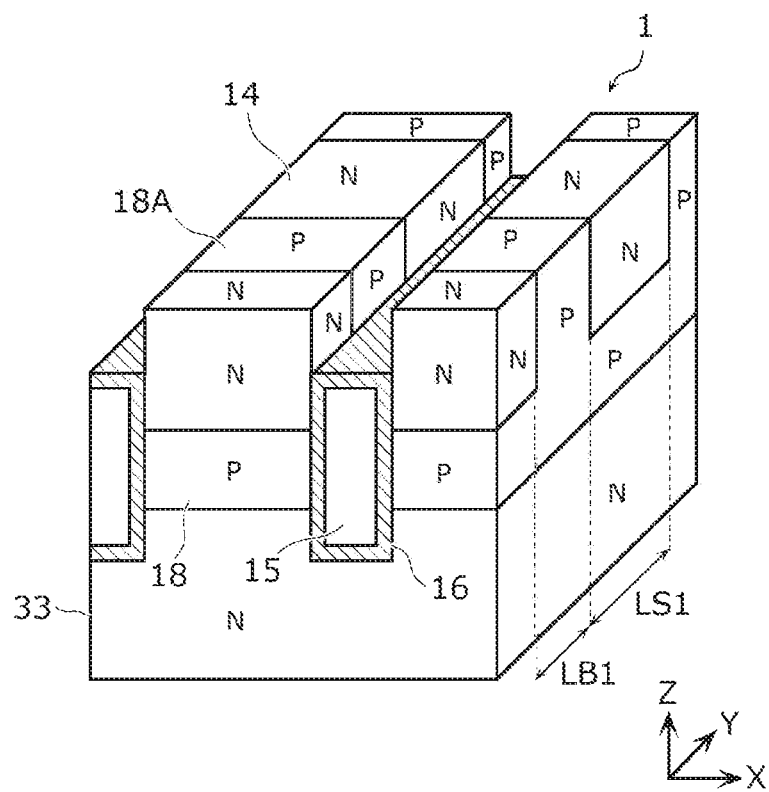
FIG. 3B is a perspective view of the configuration of the approximate single unit of the vertical transistor according to Embodiment 1.

FIG. 3A is a plan view of the configuration of an approximate single unit of transistor 10 that is repeatedly formed in a X direction and a Y direction in first region A1 of semiconductor device 1. FIG. 3B is a perspective view of the same. FIG. 3A and FIG. 3B do not show semiconductor substrate 32 and source electrode 11 for simplicity. It should be noted that the Y direction is a direction that is parallel to the top surface of semiconductor layer 40 and in which gate trench 17 extends. Additionally, the X direction is a direction that is parallel to the top surface of semiconductor layer 40 and orthogonal to the Y direction.

As shown in FIG. 3A and FIG. 3B, transistor 10 includes connector 18A that electrically connects body region 18 and source electrode 11. Connector 18A is a region of body region 18 in which source region 14 is not formed, and contains the same impurities of the second conductivity type as body region 18. Source regions 14 and connectors 18A are alternately and periodically disposed in the Y direction.

In semiconductor device 1, when a high voltage and a low voltage are applied to drain electrode 81 and source electrode 11, respectively, and a voltage greater than or equal to a threshold value is applied to gate electrode 19 (gate conductor 15) with reference to source electrode 11, a conducting channel is formed in the vicinity of gate insulating film 16 in body region 18. As a result, a principal current flows in a path from drain electrode 81 to drain lead-out region 38 to semiconductor substrate 32 to metal layer 30 to semiconductor substrate 32 to low-concentration impurity layer 33 to the conducting channel formed in body region 18 to source region 14 to source electrode 11, and semiconductor device 1 becomes conductive. It should be noted that a PN junction is in a contact surface between low-concentration impurity layer 33 and body region 18 in this conductive path and functions as a body diode. Moreover, since this principal current flows through metal layer 30, increasing the thickness of metal layer 30 makes it possible to increase the cross-sectional area of a principal current path and reduce on-resistance of semiconductor device 1.

(3. Placement of Gate, Source, and Drain)

Semiconductor device 1 shown in FIG. 2 is in a rectangular shape in a plan view. First region A1 and second region A2 that divide semiconductor device 1 in two are disposed in order for border line 90 therebetween to be a straight line parallel to longer sides among the sides constituting the perimeter of semiconductor device 1. In the plan view, a principal current that flows from second region A2 to first region A1 flows in a direction orthogonal to border line 90 between first region A1 and second region A2.

The placement on semiconductor device 1 as shown in FIG. 2 allows the principal current to flow inside semiconductor device 1 using an entire width area of border line 90. The reason why border line 90 is disposed in parallel not to the shorter sides but to the longer sides of semiconductor device 1 is that it is intended to increase a current passage width in the limited plane of semiconductor device 1 as much as possible. The reason why border line 90 is disposed as the straight line is that it is intended to reduce the occurrence of a local current concentration portion by evenly using the entire width area through which the principal current is passed. The placement shown in FIG. 2 that achieves such effects is useful especially when the principal current is a heavy current.

When a direction in which a principal current flows is defined as a first direction, in the plan view, semiconductor device 1 is disposed to cause the shorter sides of semiconductor device 1 to be parallel to the first direction and cause border line 90 and the longer sides of semiconductor device 1 to be parallel to a direction orthogonal to the first direction in which the principal current flows. When out of the longer sides of semiconductor device 1, a longer side included in first region A1 is defined as one longer side 91, and a longer side opposite to one longer side 91 and included in second region A2 is defined as other longer side 92, the principal current flows from other longer side 92 toward one longer side 91 of semiconductor device 1 in a direction parallel to the shorter sides of semiconductor device 1.

In the plan view of semiconductor device 1, border line 90 between first region A1 and second region A2 may be viewed as a virtual straight line tracing the central position of a space in which portion 13 of source electrode 11 in first region A1 is opposite to portion 83 of drain electrode 81 in second region A2, or may be viewed as the space itself having a limited width. Even in the case whereof the border line is viewed as the space itself, the space can be recognized as a line by appearance to the naked eye or with low magnification. Moreover, border line 90 may be viewed as metal wiring referred to as an equipotential ring (EQR) that can be provided at the central position.

A channel is formed in first region A1 when a voltage higher than or equal to a threshold voltage is applied to gate conductor 15. First region A1 includes an effective region to be a current path. In order for a low on-resistance, it is desirable that the effective region be disposed extensively as much as possible. Moreover, also in second region A2, in order for a low on-resistance, it is desirable that drain lead-out region 38 be disposed extensively as much as possible. In order to effectively use the entire area of border line 90 when the principal current is passed, it is desirable that, in the entire area along border line 90 except for a perimeter margin of semiconductor device 1, the effective region be close to border line 90 in first region A1, drain lead-out region 38 be close to border line 90 in second region A2, and the effective region and drain lead-out region 38 be uniformly opposite to each other across border line 90 in the entire area.

In the plan view of semiconductor device 1, border line 90 need not be located at a position that equally divides semiconductor device 1 into first region A1 and second region A2. It is desirable that border line 90 intersect each of one shorter side 93 of semiconductor device 1 and other shorter side 94 opposite to one shorter side 93 at a point that divides each of the shorter sides in the range of 2:1 to 4:1, and that second region A2 have an area smaller than an area of first region A1. Such a placement makes it possible to reduce on-resistance when a current is passed through semiconductor device 1. The following describes the reasons why.

FIG. 4 shows the results of a study on a relationship between an area ratio of first region A1 and second region A2 and on-resistance in semiconductor device 1 in a plan view, which was conducted by the inventors. FIG. 4 shows simulation results for models in each of which, in semiconductor device 1 in a square shape of 3.05 mm×3.05 mm, all the shapes of pads connected to the outside are the same perfect circular shape (a diameter of 0.35 mm) regardless of types of a source, a gate, and a drain, and the pads are disposed in a 3-by-3 equally spaced grid pattern. Dashed lines in each of layout views in FIG. 4 are border lines that separate a control region in which gate electrode 19 is disposed, an effective region in which source electrode 11 is disposed, and a drain region in which drain electrode 81 is disposed. It should be noted that the control region and the effective region are included in first region A1, and the drain region is included in second region A2.

In FIG. 4, an area occupancy ratio between the control region, the effective region, and the drain region in the plan view of semiconductor device 1 is represented by the respective numbers of gate pads, source pads, and drain pads in a simplified manner. FIG. 4 shows changes in on-resistance from the left when the proportion of the drain region in total area of semiconductor device 1 changes from 1 (=1/9) to 2 (=2/9) to 3 (=3/9) with respect to a population parameter of 9. Since the proportion of the control region (gate) in total area is constant, the proportion of the effective region (source) in total area changes as the proportion of the drain region (drain) in total area changes.

A comparison of Level 1 and Level 2 shows that although the area of the effective region (source) decreases, the on-resistance is significantly reduced due to an increase in the area of the drain region (drain). In contrast, in Level 3, although the area of the effective region (source) decreases and the area of the drain region (drain) increases, the on-resistance hardly changes, compared with Level 2.

It is clear from the above that the proportion of the drain region (drain) in total area of semiconductor device 1 has a range suitable for reducing on-resistance. The results shown in FIG. 4 indicate that it is desirable that the drain region occupy approximately 2/9 to 3/9 (0.22 to 0.33) of the area of semiconductor device 1.

An additional study was conducted focusing on a case in which, as shown in Level 3, a border line between the effective region and the drain region is a straight line parallel to a side forming a part of the perimeter of semiconductor device 1 in a plan view. FIG. 5 shows the results. Level 3 is the same as the one shown in FIG. 4. Level 4 is obtained by reducing the diameter of the pads of Level 3 (a diameter of 0.30 mm) while keeping the perfect circular shape, and disposing the pads in a 5-by-5 equally spaced grid pattern. Consequently, although the control region and the drain region decrease in area compared to Level 3, the on-resistance in Level 4 does not change from the on-resistance in Level 3.

Accordingly, regarding the case in which border line 90 between first region A1 and second region A2 is a straight line parallel to the side forming the part of the perimeter of semiconductor device 1 in a plan view, it is safe to say that a partition ratio of 2:1 to 4:1 between first region A1 and second region A2 is a range suitable for reducing the on-resistance. As shown in Level 1 in FIG. 4, when the partition ratio further falls below 4:1, it is safe to say that the on-resistance eventually becomes deteriorated. It should be noted that although the proportion of the drain region in total area is 1/9 and border line 90 is not a straight line in Level 1 in FIG. 4, the partition ratio between first region A1 and second region A2 may be viewed as 8:1.

It is clear from the results shown in FIG. 4 and FIG. 5 that a range suitable for reducing on-resistance is achieved when the effective region is larger in area than the drain region. This is thought to be related to a conductive path made by forming a channel being confined only to the vicinity of gate trench 17 in the effective region whereas entire drain lead-out region 38 becomes a conductive path in the drain region.

Level 5 shown in FIG. 5 is obtained by combining, in a plan view, some adjacent source pads and some adjacent drain pads of Level 4 into source pads and drain pads, respectively, in a rectangular shape or an obround shape (refers to a substantially rectangular shape with end portions in the longitudinal direction being in a semi-circular shape). Since it is possible to increase a contact area between semiconductor device 1 and a mounting substrate due to an increase in area of the pads, effects of reducing on-resistance and improving heat dissipation can be achieved, which is desirable. It was actually verified that the on-resistance in Level 5 is more improved than the on-resistance in Level 4, and the most desirable effect of reducing on-resistance can be achieved using the range studied.

Regarding the obround shape of the source pads and the drain pads shown in Level 5, the shape of the end portions need not be the semi-circular shape. Even when the shape of the end portions is a rectangular shape (rectangular shape itself) or a polygonal shape, the same effects can be achieved without any difficulty. Hereinafter, the rectangular shape and the obround shape may be collectively referred to as a rounded-corner rectangular shape.

It is necessary to be careful not to cause a mounting failure in increasing the area of a pad. A mounting failure refers to the formation of what is called voids due to air bubbles remaining in a pad in a plan view when semiconductor device 1 is mounted on a mounting substrate using a joint material such as solder. In particular, when the size (also simply referred to as the "width") of a pad in a rounded-corner rectangular shape is excessively large in the transverse direction (a direction orthogonal to the longitudinal direction), voids are readily formed. The study conducted by the inventors shows that limiting the width of a pad to 300 μm or less is effective in reducing voids.

It is desirable that each pad have a width of at least 300 μm, and then the total area of the pads be increased. For this reason, it is desirable that, as shown in FIG. 2, in first region A1, a plurality of source pads in a rounded-corner rectangular shape form equally spaced stripes in a plan view, and the spaces between the plurality of source pads be set to less than or equal to the widths of the plurality of source pads.

This has the effect of increasing the total area of the pads by narrowing the spaces between the plurality of source pads.

Moreover, it is desirable that the plurality of source pads in the rounded-corner rectangular shape forming the stripes have the longitudinal direction parallel to the longer sides of semiconductor device 1 in the plan view. In other words, it is desirable in the same sense that the longitudinal direction of the plurality of source pads in the rounded-corner rectangular shape be orthogonal to the first direction in which the principal current flows and be parallel to border line 90. Disposing the plurality of source pads in the rounded-corner rectangular shape to cause the longitudinal direction to be orthogonal to the first direction in which the principal current flows and be parallel to border line 90 in the plan view is most advantageous to causing the principal current to flow from second region A2 to first region A1 using the entire width area of border line 90. Disposing the plurality of source pads in the rounded-corner rectangular shape forming the stripes in the above manner achieves an effect of reducing an increase in on-resistance and a bias in current caused by the way how the plurality of source pads are disposed.

Since a pad layout as described above makes it possible to increase the total area of pads while reducing voids and remove the increasing factor of the on-resistance that can be caused by the layout to the extent, it is possible to achieve the effect of reducing the on-resistance.

Furthermore, in the plan view, the plurality of source pads in the rectangular shape or the obround shape may include at least one source pad having a length in the longitudinal direction equal to the entire length of border line 90 minus any empty space in which the at least one source pad is not disposed. In the plan view, the at least one source pad having the length in the longitudinal direction equal to the entire length of border line 90 may be close to border line 90. For that matter, in a range as long as possible along border line 90, the at least one source pad in the rectangular shape or the obround shape may be close to border line 90 in first region A1, and at least one drain pad in the rectangular shape or the obround shape may be close to border line 90 in second region A2. In the plan view, the at least one source pad in the rectangular shape or the obround shape and the at least one drain pad in the rectangular shape or the obround shape may be uniformly opposite to each other across border line 90 in the range as long as possible, to form a pair. Any of the above features enhances the effect of reducing the on-resistance using the entire area of border line 90 evenly especially when the principal current is a heavy current.

It is desirable that source pad 116 in the rounded-corner rectangular shape in the plan view have the longitudinal direction parallel to the longer sides of semiconductor device 1. Since semiconductor device 1 is in the rectangular shape in the plan view, when semiconductor device 1 is face down mounted, semiconductor device 1 necessarily warps in a direction along the longer sides at the time of a high temperature in a reflow process using a solder joint material.

At this time, however, when the longitudinal direction of source pad 116 in the rounded-corner rectangular shape is parallel to the longer sides of semiconductor device 1, it is possible to cause the solder joint material physically compressed at the longer side ends of semiconductor device 1, which have a low profile due to the warpage, to flow toward the central portion of semiconductor device 1, which has a high profile, in parallel to the direction in which semiconductor device 1 warps. Accordingly, it is possible to reduce the likelihood of the solder joint material protruding from the pads or not sufficiently spreading all over.

It has been stated in the present disclosure that the partition ratio of 2:1 to 4:1 between first region A1 and second region A2 is a range suitable for reducing on-resistance. When a decrease in area of semiconductor device 1 is required, such a partition ratio necessarily causes second region A2, that is, the width of the drain region to be narrow. In order to effectively use the narrow width of the drain region, as shown in FIG. 2, it is desirable that a drain pad be disposed in one stripe-shaped region in which the width of the drain region is used as broadly as possible, except for a margin, in the longer side direction of semiconductor device 1 in a plan view. A stripe-shaped region refers to a region that fits within a certain width in a direction.

Moreover, as shown in FIG. 2, it is desirable that the width of a drain pad in the rounded-corner rectangular shape in second region A2 be equal to the width of a source pad in the rounded-corner rectangular shape in first region A1 in a plan view, and additionally a space between source pads forming stripes in first region A1 be equal to a space between one source pad in the rounded-corner rectangular shape and one drain pad in the rounded-corner rectangular shape that are opposite to each other across border line 90.

Such a placement makes it possible to dispose a plurality of source pads and a plurality of drain pads in stripes with regularity in the plan view of semiconductor device 1, as if the plurality of source pads and the plurality of drain pads do not distinguish between first region A1 and second region A2. Such a highly symmetric pad layout makes it possible to prevent pressure applied at the time of mounting from being biased in a plane of semiconductor device 1 and heat dissipation after mounting from being biased in the plane of semiconductor device 1.

From the view point of preventing the bias from occurring in the plane of semiconductor device 1, that is, the symmetry of the pad layout, as shown in FIG. 2, it is desirable that gate pad 119 and drain pad 141 that are in the same shape in a plan view be disposed at diagonal positions in semiconductor device 1. The number of gate pads 119 is not limited to one. Gate pad 119 is connected to gate electrode 19, and gate electrode 19 covers the control region in the plan view. For this reason, causing the number of gate pads 119 to be two or more results in the expansion of gate electrode 19 connected to two or more gate pads 119 and the control region, and reducing of the effective region will be unavoidable as a consequence. Accordingly, there is a possibility that such a case brings about a structure disadvantageous to reducing on-resistance. Therefore, one gate pad 119 is sufficient. The following description is based on the premise that semiconductor device 1 includes one gate pad 119 in a circular shape as shown in FIG. 2.

Since the control region does not contribute to conduction as stated above, it is desirable that the control region be brought closer to an end of the principal current path as much as possible, not to obstruct the principal current. As shown in FIG. 2, it is desirable that the control region be disposed close to the shorter side of semiconductor device 1 in a plan view. It is further desirable that the control region be disposed, in a range close to the shorter side of semiconductor device 1, closest to first vertex 98 on one longer side 91 of semiconductor device 1. That gate pad 119 is closest to first vertex 98 formed by one longer side 91 and one shorter side 93 intersecting means that gate pad 119 is disposed to dispose none of the plurality of source pads 116 between (i) gate pad 119 and (ii) one longer side 91 and one shorter side 93.

In such a placement, it is desirable that the symmetry of the pad layout be enhanced by disposing a drain pad, which is in the same shape as gate pad 119, closest to second vertex 99 diagonally opposite to first vertex 98 of semiconductor device 1. Hereinafter, this drain pad is referred to as diagonal drain pad 142 in distinction from other drain pads 141.

That diagonal drain pad 142 is closest to second vertex 99 formed by other longer side 92 and other shorter side 94 intersecting means that diagonal drain pad 142 is disposed to dispose none of a plurality of other drain pads 141 between (i) diagonal drain pad 142 and (ii) other longer side 92 and other shorter side 94. Since the drain region may include a plurality of drain pads, even when, for example, one diagonal drain pad 142 closest to second vertex 99 is formed into the same circular shape as gate pad 119 as shown in FIG. 2, the presence of the plurality of other drain pads 141 does not significantly reduce the total area.

It should be noted that the center of gate pad 119 and the center of diagonal drain pad 142 may be on a diagonal line of semiconductor device 1 connecting first vertex 98 and second vertex 99 in the plan view. In particular, it is further advantageous to enhance the symmetry when both gate pad 119 and diagonal drain pad 142 close to the respective diagonal vertexes are in a circular shape as shown in FIG. 2.

Embodiment 2

Semiconductor device 1A according to Embodiment 2 is in a square shape in a plan view whereas semiconductor device 1 according to Embodiment 1 is in the rectangular shape in the plan view. Since there is no distinction between longer sides and shorter sides in a plan view when semiconductor device 1A is in the square shape, the sides parallel to the first direction in which the principal current flows and the sides orthogonal to the first direction described in Embodiment 1 are interpreted as "shorter sides" and "longer sides," respectively, for descriptive purposes. Although the terms "one longer side and other longer side" and the terms "one shorter side and other shorter side" may be used in the following description, the above interpretation will not cause misunderstanding. Additionally, the same reference signs are assigned to the structural components common to Embodiments 1 and 2.

A control region has a function of controlling ON and OFF of a principal current in an effective region. A gate wiring electrode (not shown) may be drawn around the effective region from gate electrode 19 included in the control region. Gate trench 17 in the effective region is enabled to apply a voltage to gate conductor 15 by the ends of gate trench 17 being connected to the gate wiring electrode drawn around the effective region. Since it is desirable that all gate trenches 17 evenly contribute to channel formation, it is desirable that the control region be disposed not to cause distances from the control region to respective gate trenches 17 to be significantly different from each other.

When the control region (gate pad 119) is disposed closest to first vertex 98 as shown in FIG. 2, it is desirable that the length of first region A1 in a shorter side direction be substantially equal to the length of first region A1 in a longer side direction in a plan view. In this way, it is possible to make the voltage applied to gate conductor 15 as even as possible not only in the first direction but also in the direction orthogonal to the first direction. Accordingly, it is desirable that first region A1 be in a square shape in a plan view.

However, when semiconductor device 1A itself is in the square shape, first region A1 is necessarily in a rectangular shape. For this reason, it is desirable that first region A1 be in a shape as close to the square shape as possible. The study conducted by the inventors shows that it is desirable that a shape of first region A1 have an aspect (length of longer side/length of shorter side) less than or equal to 1.5 to effectively use the effective region without significant in-plane imbalance. Considering the appropriate result of the partition ratio between first region A1 and second region A2 in Embodiment 1, it is desirable that first region A1 be in a rectangular shape having a length ratio between the longer side and shorter side of first region A1 in a range from 5:4 (aspect 1.25) to 3:2 (aspect 1.5).

[Variation 1]

A pad layout capable of achieving the advantageous effects of the present disclosure is not limited to the pad layout shown in FIG. 2. What is important in the present disclosure is that a semiconductor device that is a facedown mountable, chip-size-package type semiconductor device includes: a semiconductor layer; a vertical field-effect transistor provided in a first region in the semiconductor layer; and a drain lead-out region provided in a second region adjacent to the first region in the semiconductor layer in a plan view of the semiconductor layer. The semiconductor layer is in a rectangular shape in the plan view, when, in the plan view, out of longer sides of the semiconductor layer, a longer side included in the first region and a longer side included in the second region are referred to as one longer side and an other longer side, respectively, and out of shorter sides of the semiconductor layer, a shorter side defining a first vertex with the one longer side is referred to as one shorter side, and a shorter side opposite to the one shorter side is referred to as an other shorter side. A border line between the first region and the second region is a straight line parallel to the longer sides of the semiconductor layer in the plan view. The first region includes a plurality of source pads and one or more gate pads on a surface of the semiconductor layer. The second region includes a plurality of drain pads on the surface of the semiconductor layer. At least one gate pad among the one or more gate pads is disposed to dispose none of the plurality of source pads between (i) the at least one gate pad and (ii) the one longer side and the one shorter side in the plan view. At least one drain pad among the plurality of drain pads is in a same shape as the at least one gate pad in the plan view, and is disposed close to a second vertex of the semiconductor layer in the plan view, the second vertex being diagonally opposite to the first vertex. The plurality of source pads include a plurality of source pads that are, in the plan view, in a rectangular shape or an obround shape having a longitudinal direction parallel to the longer sides of the semiconductor layer. The plurality of drain pads include a drain pad that is, in the plan view, in a rectangular shape or an obround shape having a longitudinal direction parallel to the longer sides of the semiconductor layer. The plurality of source pads in the rectangular shape or the obround shape are disposed in stripes at regular intervals in the plan view. In the plan view, spaces between the plurality of source pads in the rectangular shape or the obround shape are equal to a space between a source pad and the drain pad in the rectangular shape or the obround shape that are opposite to each other across the border line, the source pad being included in the plurality of source pads in the rectangular shape or the obround shape. It is sufficient to conform to this configuration.

Semiconductor device 1 having a pad layout shown in each of FIG. 6A to FIG. 6D is also capable of achieving the advantageous effects of the present disclosure. As described below, each of FIG. 6A to FIG. 6D includes the above-described elements or features added to FIG. 2.

Figure 6A:
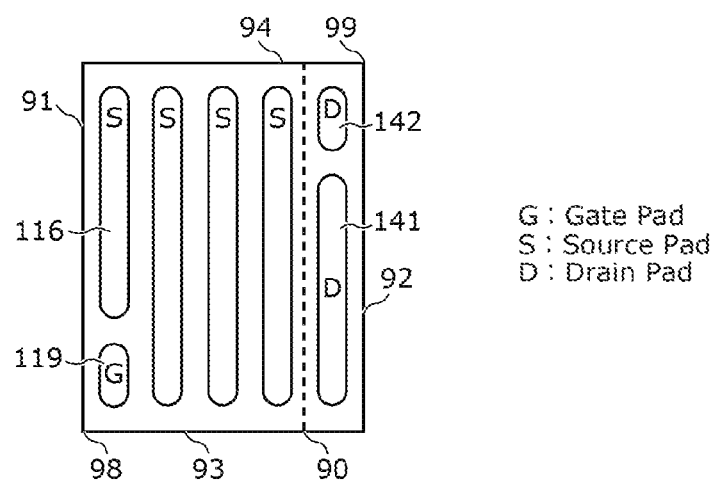
FIG. 6A is a plan view illustrating Variation Example 1 of a structure of a semiconductor device according to Embodiment 1.

FIG. 6A differs from FIG. 2 in that gate pad 119 is not in a circular shape. In the present disclosure, gate pad 119 close to first vertex 98 defined by one longer side 91 and one shorter side 93 need not be in the circular shape. However, it is required that diagonal drain pad 142 close to second vertex 99 defined by other longer side 92 and other shorter side 94 be in the same shape as gate pad 119.

FIG. 6A shows an example in which gate pad 119 and diagonal drain pad 142 are in a rounded-corner rectangular shape, but the present disclosure is not limited to the rounded-corner rectangular shape. Here, the center of a pad in a plan view of a semiconductor layer refers to the center of gravity of the shape of the pad in the plan view of the semiconductor layer. For example, when gate pad 119 is in a circular shape, the center of gate pad 119 is the center of the circle; when gate pad 119 is in a rectangular shape, the center of gate pad 119 is the intersection point of two diagonal lines of the rectangular; and when gate pad 119 is in a rounded-corner rectangular shape, the center of gate pad 119 is an intersection point of a line bisecting the rounded-corner rectangle in the longitudinal direction and a line bisecting the rounded-corner rectangle in the transverse direction.

Figure 6B:
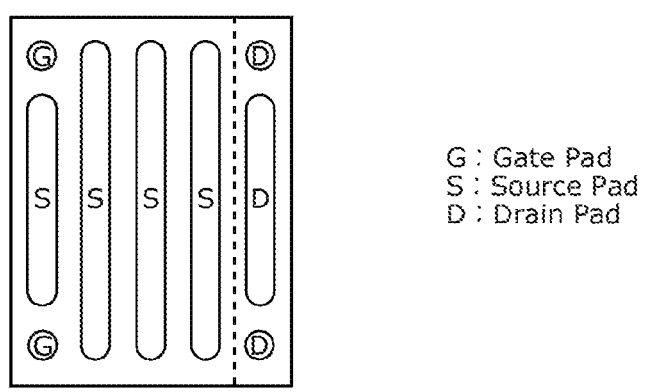
FIG. 6B is a plan view illustrating Variation Example 1 of a structure of the semiconductor device according to Embodiment 1.

As with FIG. 2, FIG. 6B shows an example in which gate pad 119 and diagonal drain pad 142 diagonally opposite to gate pad 119 are in a circular shape having the same diameter. However, FIG. 6B differs from FIG. 2 in that other pads diagonally opposite to each other and close to respective vertexes are in the circular shape having the same diameter. In other words, in the example, the pads in the circular shape having the same diameter are located at all the four corners of semiconductor device 1 in a plan view. However, a pad close to a vertex of one longer side 91 other than first vertex 98 is one of the plurality of source pads 116, and a pad diagonally opposite to this pad is one of the plurality of drain pads 141. Since such a pad layout has a high symmetry, it is possible to further reduce a failure at the time of mounting.

As shown in FIG. 2 or FIG. 6A and FIG. 6B, the plurality of source pads 116 in the rounded-corner rectangular shape may include at least one source pad having a length in the longitudinal direction equal to the entire length of border line 90 minus any empty space in which the at least one source pad is not disposed. The entire length of border line 90 is precisely the entire length of the longer side of semiconductor device 1. Such a placement makes it easy to evenly use the entire length of the longer side of semiconductor device 1 as a width through which the principal current is passed.

As shown in FIG. 2 or FIG. 6A and FIG. 6B, source pad 116 having a length in the longitudinal direction equal to the entire length of border line 90 may be close to border line 90. Such a placement makes it possible to efficiently extract the principal current passed from second region A2 in first direction in a plan view using the shortest path in first region A1, which can achieve the effect of reducing on-resistance.

Figure 6C:
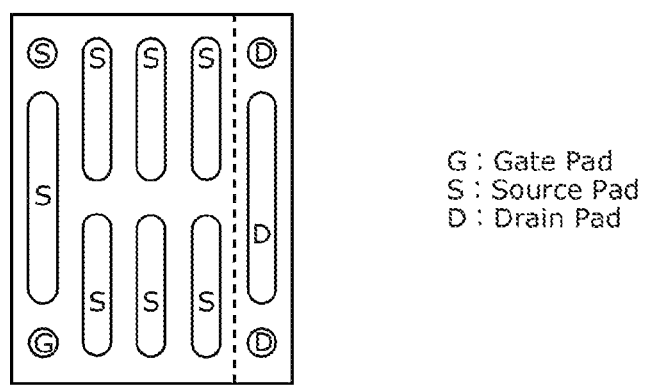
FIG. 6C is a plan view illustrating Variation Example 1 of a structure of the semiconductor device according to Embodiment 1.
Figure 6D:
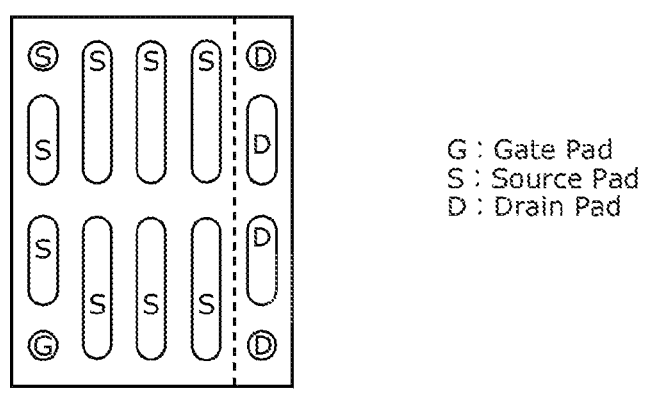
FIG. 6D is a plan view illustrating Variation Example 1 of a structure of the semiconductor device according to Embodiment 1.

FIG. 6C shows a pad layout including some or all of the plurality of source pads 116 divided at the central portion of semiconductor device 1 in the longer side direction, and drain pad 141. FIG. 6D shows a pad layout including some or all of the plurality of source pads 116 and drain pad 141 divided at the central portion of semiconductor device 1 in the longer side direction. Such pad layouts make it possible to achieve an effect of helping spread an underfill material into the entire surface of semiconductor device 1 to fill the entire surface with the underfill material after semiconductor device 1 is mounted.

[Variation 2]

Figure 7A:
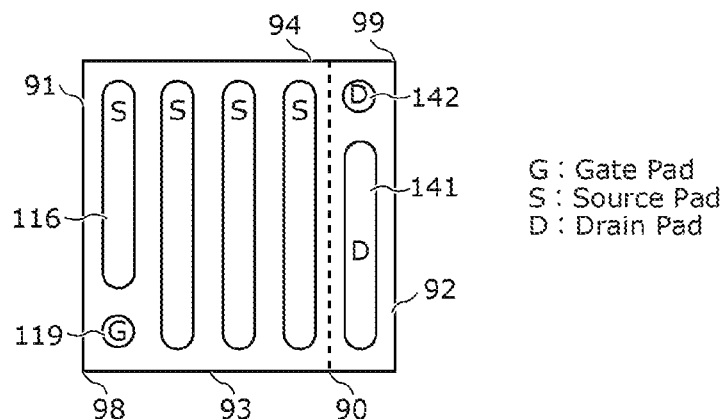
FIG. 7A is a plan view illustrating Variation Example 2 of a structure of a semiconductor device according to Embodiment 1.

FIG. 7A shows an example in which semiconductor device 1 shown in FIG. 2 is in a square shape. FIG. 7C further shows an example in which semiconductor device 1 is downsized. FIG. 7C differs from FIG. 7A in that one of the plurality of source pads 116 in the rounded-corner rectangular shape is removed. When the size of semiconductor device 1 is changed as above, one of the plurality of source pads 116 may be removed without changing the widths of the plurality of source pads 116, spaces between the plurality of source pads 116 forming stripes, and a space between source pad 116 and drain pad 141 in a plan view.

Figure 7B:
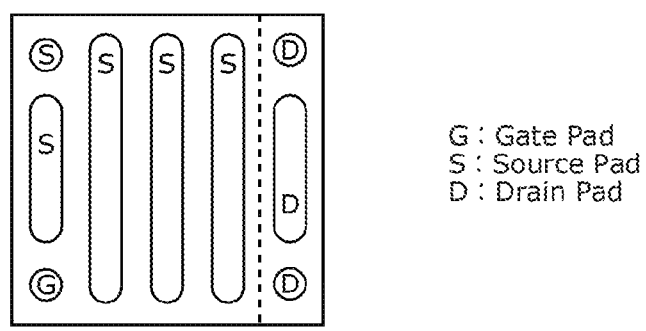
FIG. 7B is a plan view illustrating Variation Example 2 of a structure of the semiconductor device according to Embodiment 1.
Figure 7C:
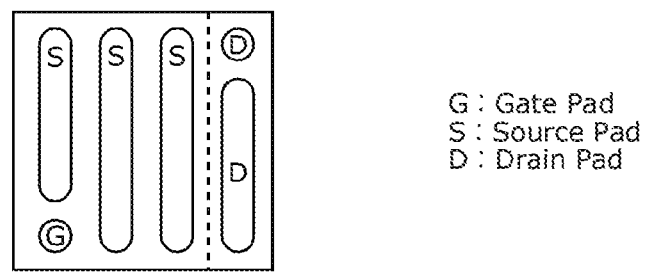
FIG. 7C is a plan view illustrating Variation Example 2 of a structure of the semiconductor device according to Embodiment 1.

Since FIG. 7B shows the same design concept as FIG. 6B in Variation 1, the description thereof will be omitted.

In any of the pad layouts illustrated in Variation 2, although semiconductor device 1 is in the square shape, a configuration formed on the surface of semiconductor device 1 by the plurality of source pads, the at least one gate pad, and the plurality of drain pads has a 180° rotational symmetry but does not have a 90° rotational symmetry about a point intersected by the diagonal lines of semiconductor device 1 in a plan view.

In conventional semiconductor device 1 in the square shape, the pad layout always has the 90° rotational symmetry, and there has been a risk of mistaking a placement orientation of semiconductor device 1 at the time of mounting due to the high symmetry. In contrast, since any of the pad layouts illustrated in Variation 2 does not have the 90° rotational symmetry, it is possible to reduce a risk of mistaking a placement orientation. Additionally, since any of the pad layouts maintains the 180° rotational symmetry, it is possible to prevent pressure applied at the time of mounting from being biased in a plane of semiconductor device 1 and heat dissipation after mounting from being biased in the plane of semiconductor device 1.

INDUSTRIAL APPLICABILITY

The semiconductor device including the vertical field-effect transistor according to the present disclosure is widely applicable as a device that controls a conduction state of a current path.

The invention claimed is:

1. A semiconductor device that is a facedown mountable, chip-size-package type semiconductor device, the semiconductor device comprising:
   a semiconductor layer;
   a vertical field-effect transistor provided in a first region in the semiconductor layer; and
   a drain lead-out region provided in a second region adjacent to the first region in the semiconductor layer in a plan view of the semiconductor layer,
   wherein the semiconductor layer is in a rectangular shape in the plan view,
   when, in the plan view, out of longer sides of the semiconductor layer, a longer side included in the first region and a longer side included in the second region are referred to as one longer side and an other longer side, respectively, and out of shorter sides of the semiconductor layer, a shorter side defining a first vertex with the one longer side is referred to as one shorter side, and a shorter side opposite to the one shorter side is referred to as an other shorter side, a border line between the first region and the second region is a straight line parallel to the longer sides of the semiconductor layer in the plan view, the first region includes a plurality of source pads and one or more gate pads on a surface of the semiconductor layer, the second region includes a plurality of drain pads on the surface of the semiconductor layer, at least one gate pad among the one or more gate pads is disposed to dispose none of the plurality of source pads between (i) the at least one gate pad and (ii) the one longer side and the one shorter side in the plan view, at least one drain pad among the plurality of drain pads is in a same shape as the at least one gate pad in the plan view, and is disposed close to a second vertex of the semiconductor layer in the plan view, the second vertex being diagonally opposite to the first vertex, the plurality of source pads include a plurality of source pads that are, in the plan view, in a rectangular shape or an obround shape having a longitudinal direction parallel to the longer sides of the semiconductor layer, the plurality of drain pads include a drain pad that is, in the plan view, in a rectangular shape or an obround shape having a longitudinal direction parallel to the longer sides of the semiconductor layer, the plurality of source pads in the rectangular shape or the obround shape are disposed in stripes at regular intervals in the plan view, and in the plan view, spaces between the plurality of source pads in the rectangular shape or the obround shape are equal to a space between a source pad and the drain pad in the rectangular shape or the obround shape that are opposite to each other across the border line, the source pad being included in the plurality of source pads in the rectangular shape or the obround shape.

2. The semiconductor device according to claim 1, wherein in the plan view, a center of the at least one gate pad and a center of the at least one drain pad are on a diagonal line of the semiconductor layer connecting the first vertex and the second vertex.

3. The semiconductor device according to claim 1, wherein in the plan view, the border line intersects each of the one shorter side and the other shorter side at an intersection point that divides the semiconductor layer at a ratio in a range of 2:1 to 4:1 in a shorter side direction of the semiconductor layer, and in the plan view, the second region has an area smaller than an area of the first region.

4. The semiconductor device according to claim 1, wherein the semiconductor layer is in a square shape in the plan view, and in the plan view, the first region is in a rectangular shape having a length ratio between longer sides and shorter sides of the first region that is in a range of 5:4 to 3:2.

5. The semiconductor device according to claim 1, wherein in the plan view, the plurality of source pads in the rectangular shape or the obround shape include at least one source pad having a length in the longitudinal direction equal to an entire length of the border line minus any empty space in which the at least one source pad is not disposed.

6. The semiconductor device according to claim 1, wherein in the plan view:

the plurality of source pads, the at least one gate pad, and the plurality of drain pads have a same width in a shorter side direction of the semiconductor layer; and spaces between the plurality of source pads are less than or equal to widths of the plurality of source pads.

7. The semiconductor device according to claim 1, wherein the semiconductor layer is in a square shape in the plan view, and in the plan view, a configuration formed on the surface of the semiconductor layer by the plurality of source pads, the at least one gate pad, and the plurality of drain pads has a 180° rotational symmetry and does not have a 90° rotational symmetry about a point intersected by diagonal lines of the semiconductor layer.

* * * * *